United States Patent
Manstretta et al.

(10) Patent No.: US 6,242,971 B1
(45) Date of Patent: Jun. 5, 2001

(54) MONOLITHICALLY INTEGRATED SELECTOR FOR ELECTRICALLY PROGRAMMABLE MEMORY CELL DEVICES

(75) Inventors: Alessandro Manstretta, Broni; Andrea Pierin, Graffignana; Guido Torelli, Sant'Alessio con Vialone, all of (IT)

(73) Assignee: STMicroelectronics, Agrate Brianza (IT)

( * ) Notice: Subject to any disclaimer, the term of this patent is extended or adjusted under 35 U.S.C. 154(b) by 0 days.

(21) Appl. No.: 09/321,961

(22) Filed: May 28, 1999

(30) Foreign Application Priority Data

May 29, 1998 (EP) .................................................. 98830332

(51) Int. Cl.[7] ....................................................... G05F 1/10
(52) U.S. Cl. ............................ 327/537; 327/544; 327/546
(58) Field of Search ..................................... 327/407–410, 327/534, 537, 544, 545, 546; 307/64, 70, 85

(56) References Cited

U.S. PATENT DOCUMENTS 4,617,473 * 10/1986 Bingham .............................. 327/546
5,157,291 * 10/1992 Shimoda ............................... 327/408
5,517,153 * 5/1996 Yin et al. .............................. 327/408

FOREIGN PATENT DOCUMENTS 0 322 002 A2   6/1989   (EP) .
0 499 110 A2   8/1992   (EP) .

* cited by examiner

Primary Examiner—Toan Tran
(74) Attorney, Agent, or Firm—Theodore E. Galanthay; Robert Iannucci; Seed IP Law Group, PLLC

(57) ABSTRACT

A selector switch monolithically integrated to a CMOS technology circuit for electrically programmable memory cell devices having at least first and second input terminals for coupling to first and second voltage generators (HV and LV), respectively, and an output terminal. First and second field-effect selection transistors are respectively connected, via first and second terminals, between the first input terminal and the output terminal and between the second input terminal and the output terminal. These transistors are driven through control terminals at non-overlapping phases and have body terminals connected at a body circuit node which is coupled to the first and second voltage generators through a bias circuit block effective to bias the node to the higher of the instant voltages generated by the first and second generators.

11 Claims, 3 Drawing Sheets

MONOLITHICALLY INTEGRATED SELECTOR FOR ELECTRICALLY PROGRAMMABLE MEMORY CELL DEVICES

TECHNICAL FIELD

This invention relates to high and low voltage selection circuits for non-volatile memories, and in particular to a high-speed selector switch integrated monolithically to a CMOS technology circuit.

BACKGROUND OF THE INVENTION

There is a growing demand for integrated circuits to be provided with different voltages for internal distribution according to which of their operative phases are to be activated. For example, semiconductor non-volatile storage devices (such as Flash, EPROM, E$^2$PROM memories), require different internal voltages for wordline biasing at different phases of the device operation. For a NORed memory, for instance, a reading operation involves biasing the wordline of the addressed cell to a voltage equal to the supply voltage ($V_{dd}$=3V or 5V), whereas that same wordline is to be applied suitably higher voltages (e.g., $V_{pp}$=12V) during the programming phase; $V_{dd}$ being a voltage supplied from outside the device, and $V_{pp}$ either a voltage supplied from outside or produced inside from $V_{dd}$. Furthermore, for multilevel EPROM storage devices, the wordline bias voltage during the read phase is a higher value than the supply voltage $V_{dd}$ (being usually of 3V or 5V). In fact, for a larger number of levels than two to be reliably allocated, the range of possible cell currents must be stretched to values of 100 to 120 $\mu$A. Such current values can only be obtained, however, by using gate voltages in the 5V to 6V range. In addition, during specific operative phases (such as those activated for testing), the wordline of the selected cell is to be brought to an analog voltage ranging from 0 to $V_{pp}$ for DMA (Direct Memory Access) reading, as those skilled in the art will recognize.

Accordingly, integrated circuits that are to operate in this way must be provided internally with a selector switch, to each time pick up and distribute an appropriate voltage to the working blocks, under control by suitable control signals.

A prior art electrically programmable non-volatile memory cell device 2 is shown in FIG. 1. The memory cell device 2 includes a selector switch 4, a row decoder 6, and a set of final decoding stages 8 for biasing respective word lines of a memory cell matrix (not shown) as needed for the differential operational phases of the memory cell device, such as reading, programming, and DMA reading.

Specifically with a non-volatile memory, there are essentially two voltages (referenced LV and HV hereinafter) involved, and the selector switch 4 is mainly concerned with biasing the wordlines. In this case, the selector switch will switch the power supply to the final decoding stages 8, as shown in FIG. 1, between the low voltage LV and the high voltage HV, according to whether the addressed cell is to be read or programmed, respectively.

It can be appreciated that, if positive voltages are to be output to the selector switch with no voltage drops, the use of p-channel pass transistors becomes mandatory. In the instance of n-well CMOS technology, the use of p-channel transistors within the selector switch creates quite a few problems because the source and drain regions of the transistors must be reverse biased, relative to the wells wherein the p-channel transistors are formed, all the time. Thus, the well regions would have to be connected to that terminal of their associated transistor which is at the highest voltage value.

However, as described in further detail hereinafter, it often is impossible to identify the highest voltage terminal of the p-channel transistors which make up the selector switch, because of its dependence on the specific operative phase being activated. A first simple circuit diagram of the selector switch is shown in FIG. 2 and includes just two p-channel transistors (P1 and P2) which are driven by a control signal PH for turning on either transistor to the exclusion of the other.

It is readily seen, however, that this simple approach rules out the possibility of using HV<LV, since there would occur forward biasing between the well region of P1 and the drain region of this transistor.

This is an important limitation placed on non-volatile storage devices, because proper operation of the selector switch cannot be assured in such modes as DMA testing and reading. In fact, the operation specifications usually provide for the user's ability to set up at will the value of HV during the read phases, with the single stipulation that it should not exceed the value of the supply voltage $V_{dd}$. In addition, considerations of constructional simplicity point to the advisability of having the DMA mode implemented through the HV terminal for accessing the node OUT of the selector switch directly. During such operations, the applied voltages may take values in the range of 0V to 12V.

Thus, the value of HV can drop below that of LV in both the DMA testing and the reading modes, and this prior approach tends to be used in a less degree.

On the other hand, the problem can be solved by using more complicated schemes, with 3 or 4 transistors and a peculiar interconnection of the wells, like that shown schematically in FIG. 3 for a three-transistor construction.

But these prior approaches, when applied to commercial devices of the EPROM type, are ill-suited for use in applications where the switching rate of the selector switch (and hence of the voltage at the node OUT) is a parameter of major consideration. In fact, the use of such circuit constructions brings about a problem of transient control of the common node N of the transistors P1 and P3. This node evolves, because of the great difference in capacitive load between it and the output terminal OUT (up to approximately 800 pF in a 4096-row memory), toward the voltage HV, upon switching the output node OUT from LV to HV (P1 and P3 being both turned on), at a definitely higher rate than the output node, so that the n-p junction formed of the N region and the well of P3 becomes forward biased.

Unfortunately, the circuit setups currently investigated to limit this bias effect invariably result in the LV/HV switching time at the output node being increased. The significance of this problem can be appreciated by considering that the program algorithm for a non-volatile memory cell (also referred to as the program-and-verify algorithm) involves the application, to the selected wordline, of a large number of high-voltage pulses, regularly interspersed with an equal number of low-voltage pulses, during which the programmed state of the cell is verified.

On the other hand, during each HV-to-LV switch of the node OUT (P1 and P3 being turned off, P2 being turned on), the problem arises that the two transistors P1, P3 cannot be turned off simultaneously. In fact, the value of HV would then remain "stored" dynamically in the intermediate node N, while the output node goes quickly to LV; here again, the n-p junction between the N region and the well of P3 becomes forward biased.

Therefore, during the HV-to-LV switching transient of the node OUT, P1 should be turned off first (in order to isolate the node N from HV), and P3 only turned off after a while (i.e., once the voltage at OUT has attained the value of LV). In this way, N and OUT are "equalized" during the transient through the transistor P3, still on.

Accordingly, the phase edges of the control signals PH and PH' must have an interval (on the order of a few $\mu s$) of non-overlap, thereby introducing unavoidable delay in the overall switching time.

Thus, the prior solutions do not suit applications which require very fast (e.g., on the order of 100–200 ns) switching of the node OUT between the voltages HV and LV.

SUMMARY OF THE INVENTION

An embodiment of this invention provides a monolithically integrated selector switch for devices comprising electrically programmable memory cells, which can combine versatility of application with circuit simplicity and operability. The switch is effective to each time find out the highest voltage present within the circuit and bias the well regions thereto.

The features and advantages of a voltage-selecting switch according to the invention can be better understood by reading the following description of an embodiment thereof, given by way of non-limitative example with reference to the accompanying drawings.

DETAILED DESCRIPTION

A voltage selecting switch according to an embodiment of the invention combines the construction and operation simplicity of the two-transistor selector switch with the versatility afforded by multi-transistor structures. In fact, having solved the problem of proper well biasing, a structure including but two transistors creates no problems of intermediate node control, as no such nodes exist therein, and is highly advantageous in terms of switching speed of the selector switch.

Figure 1:
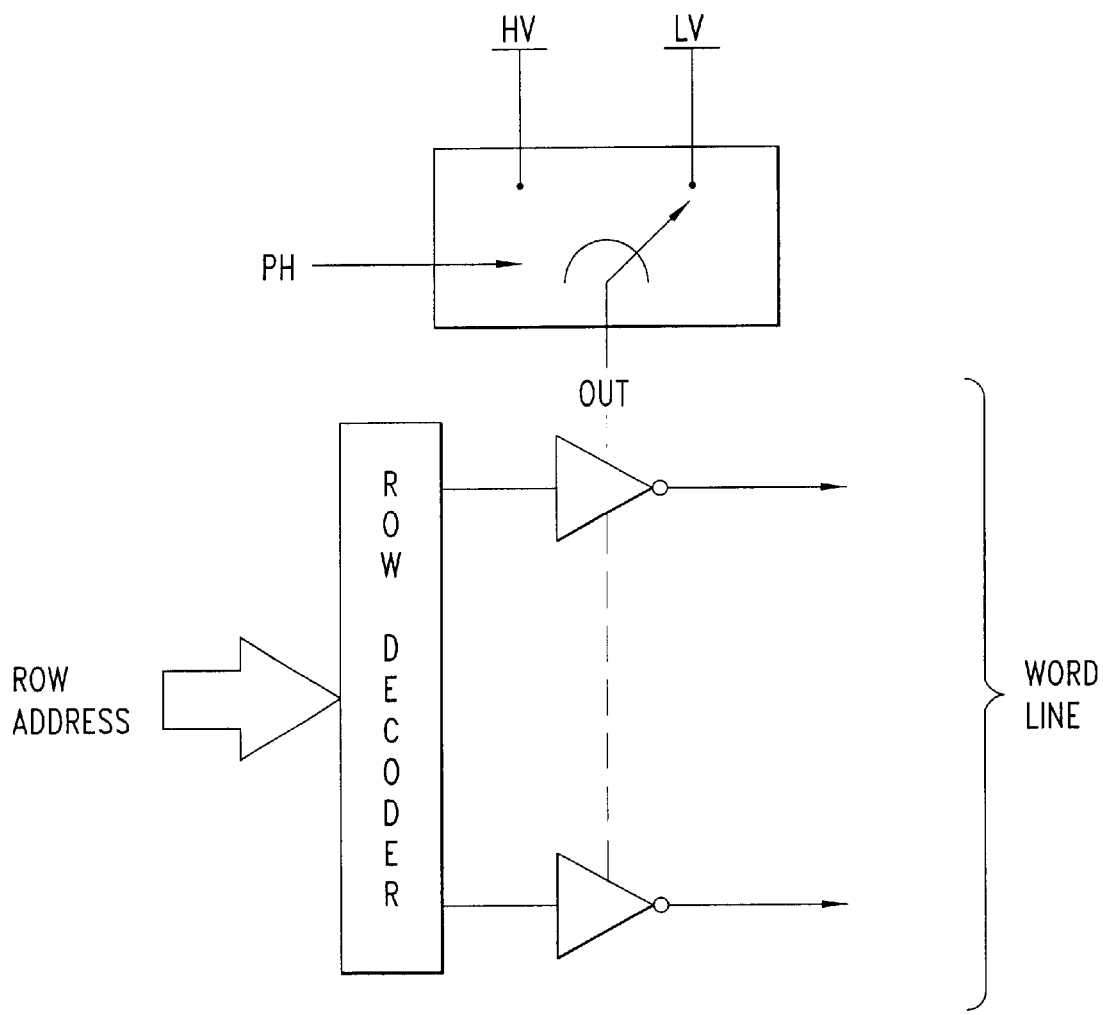
FIG. 1 shows a circuit architecture for storage devices, including a voltage selecting switch for final decoding stages.
Figure 2:
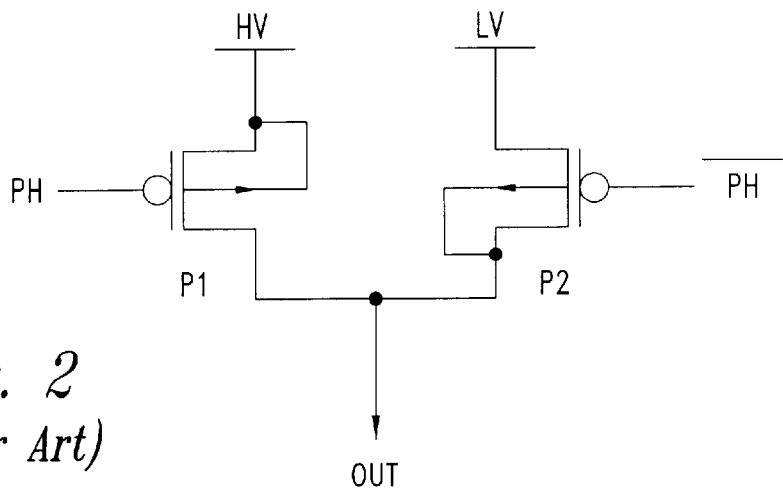
FIGS. 2 and 3 show circuit diagrams of conventional voltage-selecting switches suitable for implementation with CMOS technology.
Figure 3:
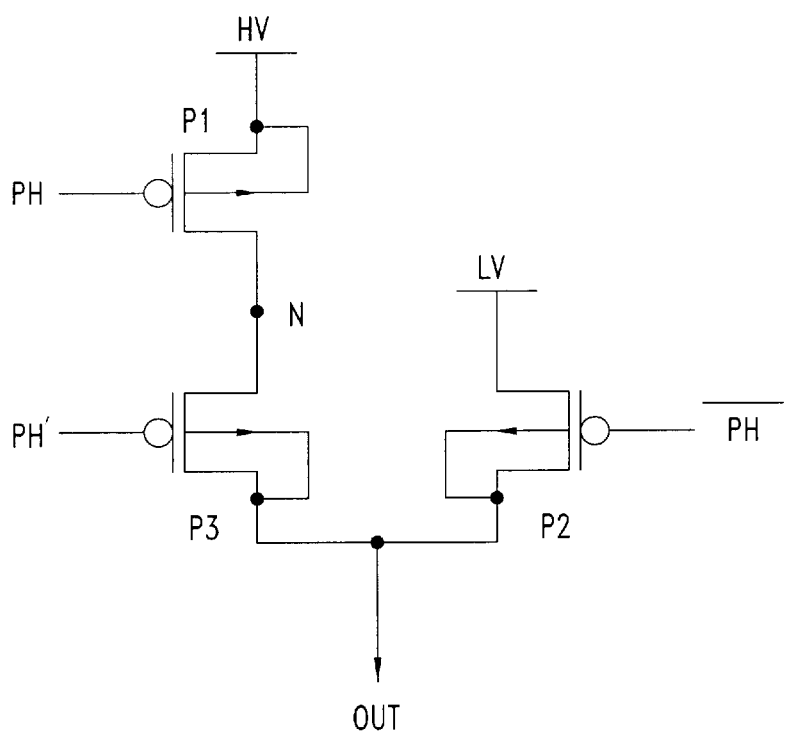
Figure 4:
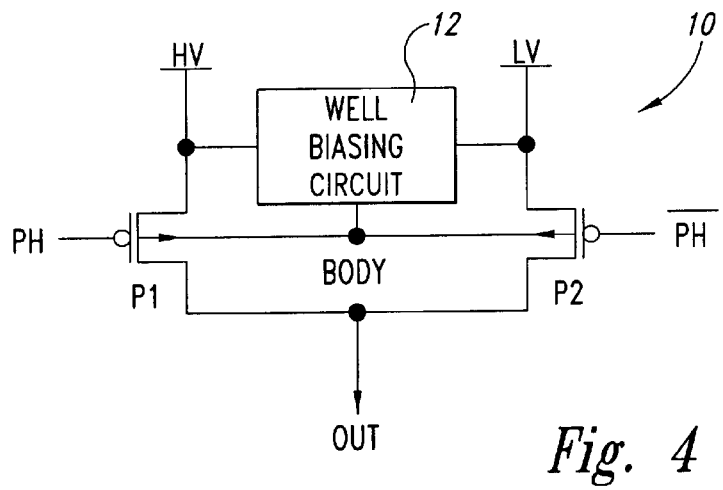
FIG. 4 shows a main diagram of a voltage-selecting switch according to an embodiment of the invention suitable for implementation in multilevel storage devices.

As shown in FIG. 4, a selector switch 10 according to the invention comprises two transistors P1 and P2 which are used as pass transistors (and form the HV/LV selector switch proper), and a Well Biasing Circuit (WBC) 12 capable of maintaining the transistor wells (connected together at the node BODY) biased to the higher of the two instant voltages HV and LV. Such a selector switch 10 is intended to replace the selector switch 4 of the prior art memory cell device 2 shown in FIG. 1.

The transistors P1, P2 are made to conduct at non-overlapping phases by control signals PH and /PH.

The selector switch 10 can be employed in two- or multi-level EPROM storage devices.

The tables herein below show possible voltage values in different modes of operation:

| MULTI-LEVEL DEVICE | | |
| --- | --- | --- |
| Mode | LV | HV |
| Read Mode | 5.5 V | 0 to $V_{dd}$ = 3 V |
| Program Mode | 5.5 V | 6 to 12 V |
| DMA Mode | 5.5 V | 0 to 12 V |

| TWO-LEVEL DEVICE | | |
| --- | --- | --- |
| Mode | LV | HV |
| Read Mode | $V_{dd}$ = 3 V | 0 to $V_{dd}$ = 3 V |
| Program Mode | $V_{dd}$ = 3 V | 12 |
| DMA Mode | $V_{dd}$ = 3 V | 0 to 12 |

The implementation of the proposed solution for multi-level applications involves, in the program mode, biasing the wells to a systematically varying voltage.

To ensure proper turn-on and turn-off of the transistors P1 and P2 at each operation phase, the generator of the PH and negated PH phases must be supplied each time with the higher of voltages HV and LV and must, therefore, be powered through the node BODY.

Actually, an optimum solution would be that of each time sensing a voltage HV", which is the program voltage and provides HV.

The value of the voltage HV" varies with the mode of operation. In the program mode, it may be $V_{pp}$=12V, and in the read mode (which is made available to the user of the device), it may lie somewhere between 0V and $V_{dd}$.

Thus, the transistor P1 can be connected to the line of the voltage HV, while the WBC block 12 is coupled directly to the high-voltage terminal HV" (whereto P1 is actually also connected indirectly). In two-level applications, HV and HV" would obviously be the same.

Figure 5:
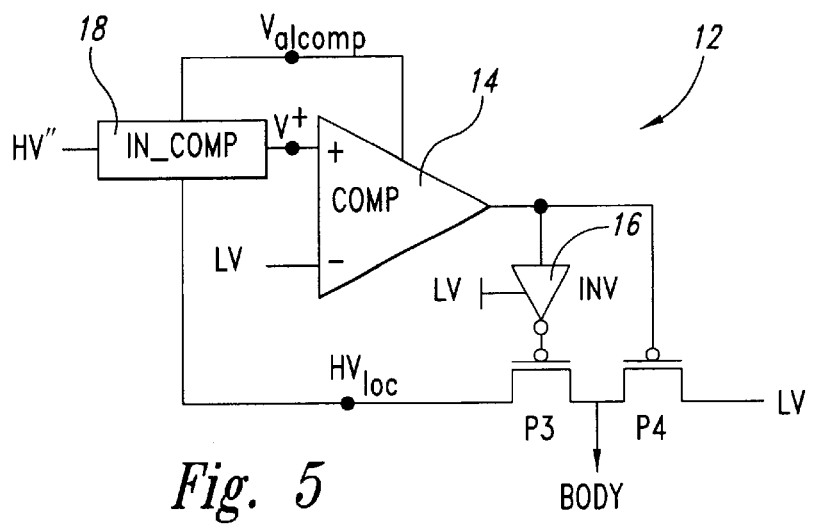
FIG. 5 is a circuit diagram, partially in block form, of a bias circuit block employed in the voltage-selecting switch of FIG. 4.

In the embodiment of the invention shown in FIG. 5, the bias circuit block 12 includes a comparator (COMP) 14 having a non-inverting (+) input terminal, an inverting (−) input terminal, and an output terminal. The inverting input terminal is coupled to the voltage LV.

Third P3 and fourth P4 field-effect transistors have respective control terminals connected to the comparator output terminal, with the control terminal of the third transistor P3 being so connected through an inverter circuit (INV) 16.

The bias circuit block further includes an input circuit block (IN_COMP) 18 having an output node V⁺ whereby the non-inverting input terminal of the comparator is coupled to the first voltage generator HV". The input circuit block 18 also is connected to a supply terminal $V_{alcomp}$ of the comparator 14.

The third P3 and fourth P4 transistors are series connected together between said input circuit block 18 and the second voltage LV. These transistors are connected together at the body circuit node BODY.

Figure 6:
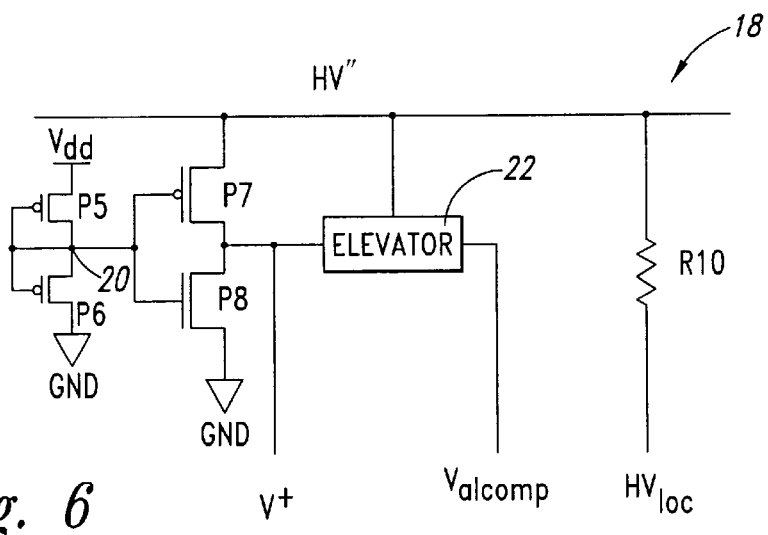
FIG. 6 is a circuit diagram of an input circuit block employed in the bias circuit block of FIG. 5.

As shown in FIG. 6, the input circuit block 18 comprises fifth P5 and sixth P6 field-effect transistors of the complementary type which are connected, in series with each other between a power supply line $V_{dd}$ and a ground GND of the memory circuit to which the selector switch 10 is integrated. The fifth and sixth field-effect transistors P5, P6 have respective control terminals connected to a linking circuit node 20 between the fifth transistor P5 and the sixth transistor P6.

Seventh P7 and eighth P8 field-effect transistors of the complementary type are connected, in series with each other between the voltage generator HV" and the ground GND. They have respective control terminals connected to the linking circuit node 20, and are connected in series with each other at a circuit node which forms the output node V+ of the input circuit block.

This output node V+ of the input circuit block 18 is connected directly to the non-inverting (+) terminal of the comparator 14, and via a voltage step-up circuit (ELEVATOR) 22, to the supply terminal $V_{alcomp}$ of the comparator. The construction of the voltage step-up circuit 22 is well within the capabilities of those skilled in the art.

A resistive element R10 is connected between the first voltage HV" and the third transistor P3 at a node $HV_{loc}$.

By means of the input circuit block 18 being connected to its non-inverting input terminal, the comparator 14 can output a logic zero in the presence of a voltage HV"$\leq V_{dd}$ (as in the read mode), or otherwise, a value same as HV" (as in the program mode).

This solution ensures that the comparator 14 will be turned off (with attendant advantages in terms of power consumption), since it forces the supply to the comparator to be canceled at all the phases (read and test modes) where its operation is unnecessary. In fact, the voltage for well biasing is always LV, and the selection of this voltage is ensured by the logic zero value presented at the output by the turned off comparator 14.

The time when HV" reaches and exceeds the value of LV (at which time the well biasing circuit 12 should theoretically turn off the transistor P5 and turn on P4 in order to connect the well node BODY to the rising one of the voltages) should be preceded by activation of the comparator to enter the program mode operation. In fact, any delay in sensing this transition would result in the wells being forward biased, relative to the source diffusions connected to HV", and the more so the higher the rate of change of the voltage HV".

The well biasing circuit 12 unavoidably introduces a delay in input-to-output propagation, and accordingly, the activation of the comparator 14 is to take place substantially in advance of the crossing time of HV" with respect to LV. This is provided by the input block 18 to the comparator 14 outputting a voltage equal to HV" as soon as HV" overtakes $V_{dd}$ (that is, while it is still below the value of LV if $V_{dd}$=3V or 5V).

While from a logic standpoint, the supply terminal ($V_{alcomp}$) of the comparator, the non-inverting input of the comparator (V+), and the high voltage for well biasing ($HV_{loc}$) should be one signal during the transition to the program mode, from a physical standpoint it is advisable to have the three voltages clearly separated, as shown in FIG. 6.

The input block 18 has three outputs, each dedicated to generating a different signal: one output will relate to the comparator input signal (V+), another to the comparator supply ($V_{alcomp}$), and the third to the local HV signal ($HV_{loc}$) used to bias the wells.

In this way, during the initial phase of the transition from the read mode to the program mode (i.e., when HV" begins to rise but is yet to reach LV), the three signals will be coincident, but become different upon HV" crossing LV. In particular, the non-inverting input V+ of the comparator will keep evolving toward the steady-state value of 12V (following HV"), without undergoing any delay within the range of LV (with substantial advantages in terms of unbalance of the comparator inputs, and hence of comparator switching speed). On the contrary, the local $HV_{loc}$ will be slowed down considerably within the very range of the trigger voltage LV, with substantial advantages in terms of limitation to possible well/diffusion forward biasings. In addition, $HV_{loc}$ will suffer no voltage drop in its steady state from the current draw of the comparator, since this current is supplied from an independent leg (the leg $V_{alcomp}$).

In summary, an important advantage is that the switching rate of the selector switch 10 is high (switching time at the node OUT on the order of 100 ns, as against some μs of conventional designs having 3 or 4 transistors).

The simple construction of the selector switch itself, as provided by the use of just two pass transistors, avoids the need for intermediate nodes, whose transient control would bring about an unavoidably slower switching rate for the selector switch.

For a two- or multi-level non-volatile storage device, the high switching rate results in an important reduction of the programming times, in view of the programming involving continual HV/LV and LV/HV switching of the addressed wordline (by the program-and-verify technique).

Changes and modifications may be made to the embodiment discussed above.

For example, a second, highly conductive path may be added in parallel with a resistor R10 which would be activated with delay from the time when LV is crossed. In this way, the transient RC time constant (as set by R10) would be quite unrelated to the impedance (as set by the second path) presented by $HV_{loc}$ in the steady-state condition.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A selector switch monolithically integrated in a CMOS technology circuit for electrically programmable memory cell devices, the selector switch comprising at least first and second input terminals for coupling to first and second voltage generators, respectively; an output terminal; and first and second field-effect selection transistors being respectively connected between the first input terminal and the output terminal and between the second input terminal and the output terminal, said transistors being driven through control terminals at non-overlapping phases and having body terminals connected to each other at a body circuit node coupled to the first and second voltage generators through a bias circuit block effective to bias said node to the higher of the instant voltages generated by the first and second generators, wherein the bias circuit block comprises:

a comparator having a non-inverting input terminal, an inverting input terminal coupled to the second voltage generator, and an output terminal;

third and fourth field-effect transistors having respective control terminals connected to the output terminal of the comparator, with the control terminal of the third field-effect transistor being connected to the output terminal of the comparator through an inverting circuit, the third field-effect transistor having first and second conduction terminals, and the fourth field-effect transistor having a first conduction terminal coupled to the second voltage generator, and a second conduction terminal coupled to the first conduction terminal of the third field-effect transistor; and an input circuit block through which the non-inverting input terminal of the comparator is coupled to the first voltage generator, and to which a supply terminal of the comparator also is connected, and having an output terminal coupled to the second terminal of the third field-effect transistor.

2. A monolithically integrated selector switch according to claim 1, wherein the input circuit block comprises complementary fifth and sixth field-effect transistors which are connected in series with each other between a power supply line and a ground of the circuit to which the selector switch is integrated and have each a control terminal connected to a linking circuit node between said fifth and sixth transistors; and further comprises complementary seventh and eighth field-effect transistors which are connected in series with each other between the first voltage generator and ground and have respective control terminals connected to said circuit linking node, said seventh and eighth transistors being connected to each other at a circuit node forming an output node of the input circuit block.

3. A monolithically integrated selector switch according to claim 2, wherein said output node of the input circuit block is connected directly to the non-inverting terminal of the comparator and, through a voltage step-up interface circuit, to the supply terminal of the comparator, and the input circuit block further comprises a resistive element connected between the first voltage generator and the third transistor.

4. An electrically programmable non-volatile memory cell device, comprising at least one voltage-selecting switch that includes:

first and second input terminals for coupling to first and second supply voltages, respectively;

an output terminal;

first and second selection transistors respectively connected between the first input terminal and the output terminal and between the second input terminal and the output terminal, said transistors having body terminals connected to each other at a body circuit node; and a bias circuit block coupled to the body circuit node for setting the body terminals at a bias determined by the bias circuit block, wherein the bias circuit block includes a first bias transistor coupled between the first supply voltage and the body circuit node and a second bias transistor coupled between the second supply voltage and the body circuit node, the first and second bias transistors being inversely responsive to a bias control signal to alternately electrically connect the first and second voltage supplies to the bias circuit node.

5. A selector switch, comprising:

first and second input terminals for coupling to first and second supply voltages, respectively;

an output terminal;

first and second selection transistors respectively connected between the first input terminal and the output terminal and between the second input terminal and the output terminal, said transistors having body terminals connected to each other at a body circuit node; and a bias circuit block coupled to the body circuit node for setting the body terminals at a bias determined by the bias circuit block, wherein the bias circuit block includes a first bias transistor coupled between the first supply voltage and the body circuit node and a second bias transistor coupled between the second supply voltage and the body circuit node, the first and second bias transistors being inversely responsive to a bias control signal to alternately electrically connect the first and second voltage supplies to the bias circuit node.

6. The selector switch of claim 5 wherein the bias circuit block further includes a comparator having a first input coupled to the first voltage supply, a second input coupled to the second voltage supply, and an output at which the bias control signal is produced, the output being coupled directly to one of the bias transistors and via an inverter to the other one of the bias transistors.

7. The selector switch of claim 6 wherein the comparator includes a supply terminal at which power is supplied to the comparator and the bias circuit block further includes a comparison circuit having a first input coupled to the first supply voltage, a second input coupled to a third supply voltage, and an output coupled to the supply terminal of the comparator, the comparison circuit being structured to couple the comparator supply terminal to ground if the first supply voltage is less than the third supply voltage.

8. The selector switch of claim 6 wherein the bias circuit block includes a first pair of complementary transistors coupled between a third supply voltage and ground and a second pair of complementary transistors coupled between the first supply voltage and ground, the first pair having control and drain terminals coupled to each other and to control terminals of the second pair, which has an output terminal coupled to the first input of the comparator.

9. The selector switch of claim 8 wherein the bias circuit block further includes an elevator circuit coupled between the output terminal of the second pair and a supply terminal of the comparator.

10. The selector switch of claim 9 wherein the bias circuit block further includes a resistor coupled between the first supply voltage and the first bias transistor.

11. A method of selectively switching an output terminal into electrical connection with either of first and second supply voltages respectively coupled to the output terminal by first and second transistors having respective body terminals coupled to each other, the method comprising:

comparing the first supply voltage with a third supply voltage used by a circuit to which the output terminal is coupled;

if the comparing act determines that the first supply voltage is greater than the third supply voltage, then:
transmitting the first supply voltage to a comparator;
comparing the first supply voltage to the second supply voltage using the comparator;
if the first supply voltage is less than the second supply voltage, then electrically connecting the second supply voltage to the body terminals; and
if the first supply voltage is greater than the second supply voltage, then electrically connecting the first supply voltage to the body terminals; and if the comparison of the first supply voltage with the third supply voltage determines that the first supply voltage is less than the third supply voltage, then responding by keeping the comparator turned off and electrically connecting the second voltage supply to the body terminals.

* * * * *